United States Patent
Lee et al.

(10) Patent No.: US 11,201,241 B2
(45) Date of Patent: Dec. 14, 2021

(54) VERTICAL FIELD EFFECT TRANSISTOR AND METHOD OF MANUFACTURING A VERTICAL FIELD EFFECT TRANSISTOR

(71) Applicant: International Business Machines Corporation, Armonk, NY (US)

(72) Inventors: Choonghyun Lee, Rensselaer, NY (US); Alexander Reznicek, Troy, NY (US); Xin Miao, Slingerlands, NY (US); Richard Glen Southwick, III, Halfmoon, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 103 days.

(21) Appl. No.: 16/735,946

(22) Filed: Jan. 7, 2020

(65) Prior Publication Data

US 2021/0210634 A1 Jul. 8, 2021

(51) Int. Cl.
*H01L 29/78* (2006.01)
*H01L 29/66* (2006.01)
(Continued)

(52) U.S. Cl.
CPC ...... *H01L 29/7827* (2013.01); *H01L 21/0217* (2013.01); *H01L 21/3065* (2013.01);
(Continued)

(58) Field of Classification Search
CPC ............. H01L 29/0847; H01L 29/1037; H01L 29/42364; H01L 29/42392; H01L 29/495; H01L 29/4966; H01L 29/4991; H01L 29/517; H01L 29/6656; H01L 29/66666; H01L 29/7827; H01L 29/78647; H01L 29/78654; H01L 21/02164; H01L 21/0217; H01L 21/02178; H01L 21/02181;
(Continued)

(56) References Cited

U.S. PATENT DOCUMENTS 9,024,383 B2 * 5/2015 Gamerith .......... H01L 29/66734
257/342
9,299,835 B1 3/2016 Anderson et al.
(Continued)

OTHER PUBLICATIONS

Anonymous, "Method for Fabricating a Vertical FET with Air-Gap Top Spacer," IP.com No. IPCOM000245671D, IP.com Electronic Publication Date: Mar. 28, 2016, 6 pages.

*Primary Examiner* — Maliheh Malek
(74) *Attorney, Agent, or Firm* — Jeffrey M. Ingalls

(57) ABSTRACT

A method of forming a vertical transport field-effect transistor (VFET) is provided. The method includes forming vertical fin channels by etching part way through a substrate. The method further includes forming a bottom source/drain electrode partially into the substrate and beneath the vertical fin channels. A gate dielectric layer is then formed on the vertical fin channels. A gate conductor layer is then formed on the gate dielectric layer. A height of the gate conductor layer is less than a height of the vertical fin channels. The method further includes forming a spacer layer on a top surface of the gate conductor layer. The method also includes forming a top source/drain electrode on a top surface of the vertical fin channels. A gap exists between the top source/drain electrode and the spacer layer.

20 Claims, 10 Drawing Sheets

(51) Int. Cl.

| | |
|---|---|
| *H01L 29/49* | (2006.01) |
| *H01L 29/51* | (2006.01) |
| *H01L 29/08* | (2006.01) |
| *H01L 29/10* | (2006.01) |
| *H01L 21/8234* | (2006.01) |
| *H01L 21/3065* | (2006.01) |
| *H01L 21/02* | (2006.01) |
| *H01L 27/088* | (2006.01) |
| *H01L 21/764* | (2006.01) |
| *H01L 21/306* | (2006.01) |
| *H01L 29/423* | (2006.01) |

(52) U.S. Cl.
CPC .... *H01L 21/764* (2013.01); *H01L 21/823412* (2013.01); *H01L 21/823418* (2013.01); *H01L 21/823437* (2013.01); *H01L 21/823462* (2013.01); *H01L 21/823481* (2013.01); *H01L 21/823487* (2013.01); *H01L 27/088* (2013.01); *H01L 29/0847* (2013.01); *H01L 29/1037* (2013.01); *H01L 29/495* (2013.01); *H01L 29/4966* (2013.01); *H01L 29/517* (2013.01); *H01L 29/6656* (2013.01); *H01L 21/30625* (2013.01)

(58) Field of Classification Search
CPC ......... H01L 21/02183; H01L 21/02189; H01L 21/02266; H01L 21/02271; H01L 21/30604; H01L 21/30625; H01L 21/3065; H01L 21/3081; H01L 21/31055; H01L 21/32115; H01L 21/764; H01L 21/823412; H01L 21/823418; H01L 21/823437; H01L 21/823462; H01L 21/823481; H01L 21/823487; H01L 21/088

See application file for complete search history.

(56) References Cited

U.S. PATENT DOCUMENTS

| | | | |
|---|---|---|---|
| 9,368,572 B1* | 6/2016 | Cheng | H01L 27/1248 |
| 9,443,982 B1 | 9/2016 | Balakrishnan et al. | |
| 9,698,245 B2 | 7/2017 | Cheng et al. | |
| 9,748,380 B1 | 8/2017 | Lie et al. | |
| 9,780,194 B1 | 10/2017 | Balakrishnan et al. | |
| 9,853,028 B1* | 12/2017 | Cheng | H01L 29/517 |
| 9,859,166 B1 | 1/2018 | Cheng et al. | |
| 9,876,015 B1* | 1/2018 | Balakrishnan | H01L 29/66545 |
| 9,929,246 B1 | 3/2018 | Cheng et al. | |
| 9,941,378 B2 | 4/2018 | Basker et al. | |
| 10,115,820 B2 | 10/2018 | Yeh et al. | |
| 10,262,904 B2* | 4/2019 | Gluschenkov | H01L 29/7827 |
| 10,418,368 B1 | 9/2019 | Bentley | H01L 21/743 |
| 10,504,794 B1* | 12/2019 | Lee | H01L 29/0847 |
| 10,505,048 B1* | 12/2019 | Xu | H01L 29/6656 |
| 10,749,011 B2* | 8/2020 | Bi | H01L 29/66666 |
| 2017/0330951 A1* | 11/2017 | Basker | C23C 14/081 |
| 2018/0277675 A1* | 9/2018 | Cheng | H01L 29/66666 |
| 2019/0172924 A1* | 6/2019 | Jagannathan | H01L 29/517 |
| 2019/0371920 A1* | 12/2019 | Xu | H01L 29/42356 |
| 2019/0393104 A1* | 12/2019 | Ando | H01L 21/02532 |
| 2020/0058766 A1* | 2/2020 | Lee | H01L 21/31116 |
| 2020/0098620 A1* | 3/2020 | Lee | H01L 21/7682 |
| 2020/0119190 A1* | 4/2020 | Cheng | H01L 29/7827 |
| 2020/0135871 A1* | 4/2020 | Tsai | H01L 21/32051 |
| 2020/0135893 A1* | 4/2020 | Bi | H01L 29/7827 |
| 2020/0136035 A1* | 4/2020 | Cheng | H01L 27/2454 |
| 2020/0176611 A1* | 6/2020 | Lee | H01L 29/66666 |
| 2020/0235238 A1* | 7/2020 | Lee | H01L 29/42376 |
| 2020/0259000 A1* | 8/2020 | Mochizuki | H01L 21/823487 |
| 2020/0303497 A1* | 9/2020 | Yeh | H01L 21/823885 |
| 2020/0321448 A1* | 10/2020 | Xu | H01L 27/092 |
| 2020/0373434 A1* | 11/2020 | Lee | H01L 29/66742 |
| 2020/0395467 A1* | 12/2020 | Yu | H01L 21/324 |
| 2021/0111270 A1 | 4/2021 | Sohn | H01L 21/823885 |
| 2021/0193527 A1* | 6/2021 | Reznicek | H01L 21/823418 |
| 2021/0249315 A1* | 8/2021 | Lee | H01L 27/092 |
| 2021/0265422 A1* | 8/2021 | Wu | H01L 29/78642 |
| 2021/0273077 A1* | 9/2021 | Xie | H01L 29/7827 |
| 2021/0296184 A1* | 9/2021 | Xie | H01L 21/823878 |

* cited by examiner

VERTICAL FIELD EFFECT TRANSISTOR AND METHOD OF MANUFACTURING A VERTICAL FIELD EFFECT TRANSISTOR

BACKGROUND

The present disclosure relates to vertical transport field effect transistors (VFETs) and methods of manufacturing VFETs.

As opposed to planar complementary metal oxide semiconductor (CMOS) devices, VFETs are oriented with a vertical fin channel disposed on bottom source and drain electrodes. Also, top source and drain electrodes are disposed on the fin channel. VFETs are being explored as a viable device option for continued CMOS scaling beyond the 7 nanometer (nm) technology node.

VFETs include a top spacer layer, and low-κ dielectric materials are generally required for the top spacer to reduce parasitic capacitive coupling between the top source/drain electrodes and the gate electrode.

SUMMARY

Embodiments of the present disclosure relate to a method of manufacturing a vertical transport field-effect transistor (VFET). The method includes forming vertical fin channels by etching part way through a substrate. The method further includes forming a bottom source/drain electrode partially into the substrate and beneath the vertical fin channels. A gate dielectric layer is then formed on the vertical fin channels. A gate conductor layer is then formed on the gate dielectric layer. A height of the gate conductor layer is less than a height of the vertical fin channels. The method further includes forming a spacer layer on a top surface of the gate conductor layer. The method also includes forming a top source/drain electrode on a top surface of the vertical fin channels. A gap exists between the top source/drain electrode and the spacer layer. This gap has an effect of reducing the parasitic capacitive coupling, which improved the functioning of the VFET devices.

Other embodiments relate to a VFET device formed by the method described above.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

The present disclosure describes embodiments of vertical transport field effect transistors (VFETs), and methods of manufacturing VFETs.

Most low-κ dielectric materials include oxygen in the film (e.g., SiCO, SiCON and SiBCON, etc.), resulting in interfacial layer regrowth and threshold voltage shift. Due to the limited amount of space for top source/drain electrode epitaxial growth in the VFET structure, the top source/drain electrode growth is not a self-limited diamond-shape, but it is confined epitaxial growth. This structure results in an increase in the parasitic capacitive coupling between the gate electrode and the top source/drain electrodes. This increase in parasitic capacitive coupling can cause degradation in the performance of the VFET devices.

The embodiments of the present disclosure describe VFETs with an inverse T-shaped top spacer. The inverse T-shaped top spacer allows for air gaps to exist between the top source/drain electrode and lower portions of the T-shaped spacer layer. The air gaps have the effect of reducing an amount of parasitic capacitive coupling, which improves the functioning of the VFETs. Other embodiments described herein have differently shaped spacer layers, but also include air gaps in a similar location.

Figure 1:
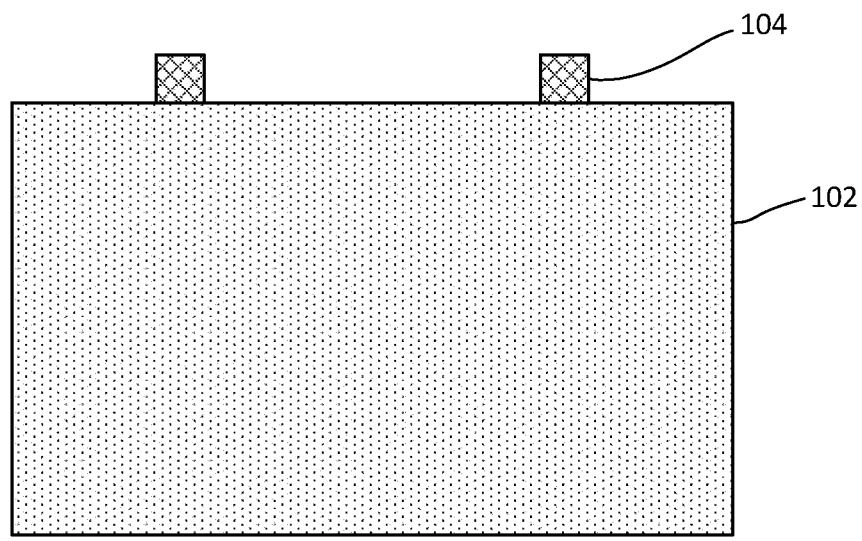
FIG. 1 is a cross-sectional view of the substrate and fin hardmasks of a vertical field effect transistor (VFET), according to embodiments.

Referring now to the drawings in which like numerals represent the same or similar elements and initially to FIG. 1, a VFET device is shown including a substrate 102 and fin hardmasks 104, according to embodiments. According to an embodiment, substrate 102 is an undoped silicon (Si) substrate such as a bulk Si wafer, or a silicon-on-insulator (SOI) wafer. In general, an SOI wafer includes an SOI layer separated from an underlying substrate by a buried insulator. When the buried insulator is an oxide it is often referred to as a buried oxide or BOX. It should be appreciated that the material of the substrate may be any suitable material or combination of materials known to one of skill in the art, and it may be a single layer or a plurality of sublayers.

In an embodiment, the fin hardmasks 104 are formed on the substrate 102 using standard lithography and etching techniques. For instance, a hardmask material can be deposited onto the substrate 102, and then patterned into the individual fin hardmasks 104. Suitable fin hardmask materials include, but are not limited to, nitride hardmask materials such as silicon nitride (SiN).

Figure 2:
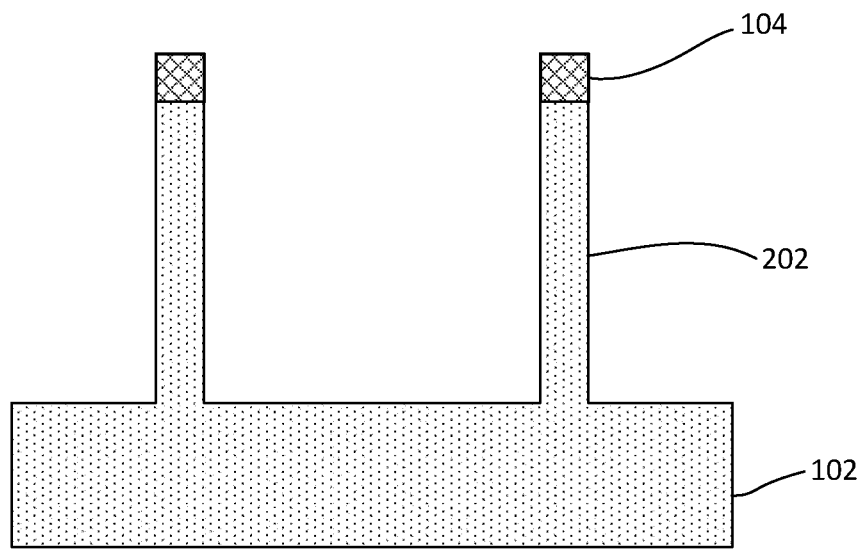
FIG. 2 is a cross-sectional view of the VFET of FIG. 1, where the substrate has been etched to form vertical fin channels, according to embodiments.

Referring now to FIG. 2, vertical fin channels 202 are then etched in the (Si) substrate 102 using the fin hardmasks 104. As shown in FIG. 2, the fin etching process ends when the vertical fin channels 202 are formed partway through the substrate 102. Therefore, an unpatterned portion of the substrate 102 remains beneath the vertical fin channels 202, with the vertical fin channels 202 extending from the surface of the substrate.

Figure 3:
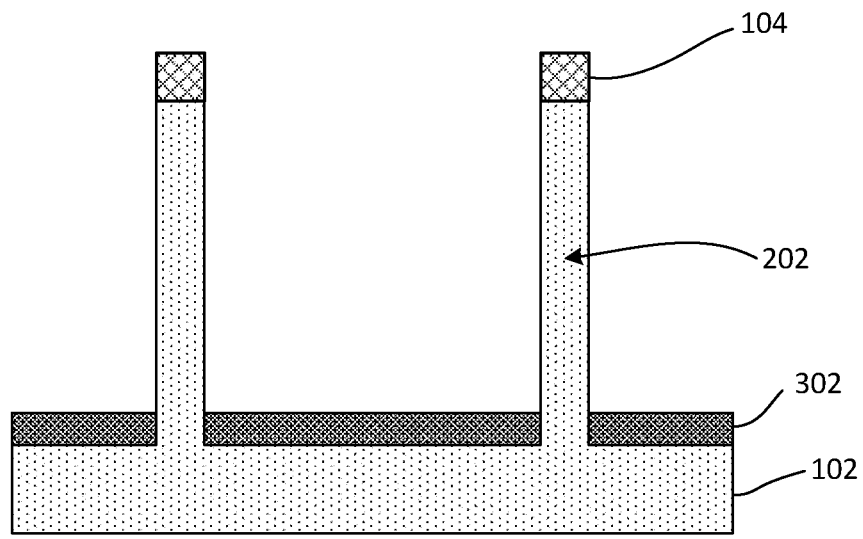
FIG. 3 is a cross-sectional view of the VFET of FIG. 2, where a bottom source/drain electrode is formed on the substrate, according to embodiments.

Referring now to FIG. 3, a bottom source/drain electrode 302 is then formed on the substrate 102 beneath the vertical fin channels 202. According to an embodiment, the bottom source/drain electrode 302 is formed by ion implantation whereby a suitable n-type or p-type dopant is implanted into the substrate 102 and beneath the vertical fin channels 202. Suitable n-type dopants include, but are not limited to, phosphorous (P) and arsenic (As). Suitable p-type dopants include, but are not limited to, boron (B). Formation of the bottom source/drain electrode 302 creates a bottom junction between the bottom source/drain electrode 302 and the vertical fin channels 202.

Figure 4:
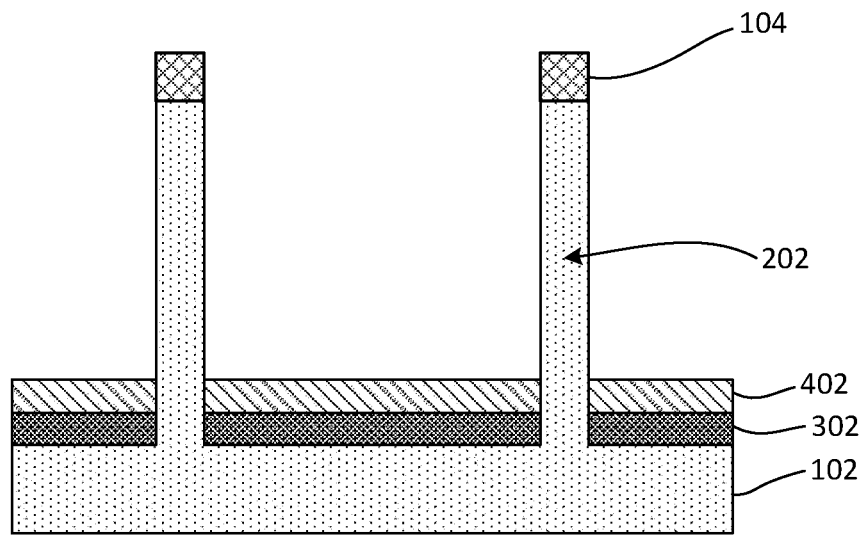
FIG. 4 is a cross-sectional view of the VFET of FIG. 3, where a bottom spacer layer is formed on the bottom source/drain electrode, according to embodiments.

Referring now to FIG. 4, a bottom spacer layer 402 is formed on the bottom source/drain electrode 302 and between adjacent vertical fin channels 202. As discussed in further detail below, the bottom spacer layer 402 offsets the bottom source/drain electrode 302 from the gate electrode (that will be formed surrounding the vertical fin channel 202). According to an embodiment, the bottom spacer layer 402 is formed using a directional deposition process whereby a spacer material is deposited onto the bottom source/drain electrode 302 and the vertical fin channels 202 with a greater amount of the material being deposited on the horizontal surfaces, as compared to the vertical surfaces. That is, a greater thickness of the material of the bottom spacer layer 402 will be deposited on top of the bottom source/drain electrode 302 in between the vertical fin channels 202 than along the sidewalls of the vertical fin channels 202. Thus, when etching is later used to remove the relatively small amount of the spacer material on the sidewalls, the material of the bottom spacer layer 402 is removed from every vertical surface. However, since there is much more material on the horizontal surfaces, the etching can be stopped at an appropriate time after the material is removed from the vertical surfaces, leaving the bottom spacer layer 402 shown in FIG. 4 on top of the bottom source/drain electrode 302. For example, a high-density plasma (HDP) chemical vapor deposition (CVD) or physical vapor deposition (PVD) process can be used for directional film deposition, and an isotropic etch can be used to remove the (thinner) spacer material deposited onto the vertical surfaces. Suitable materials for the bottom spacer 402 include, but are not limited to, oxide spacer materials such as silicon dioxide ($SiO_2$) and/or silicon carbon oxide (SiCO), and nitride spacer materials such as silicon nitride (SiN), silicon boron carbon nitride (SiBCN), silicon oxycarbon nitride (SiOCN), and/or silicon carbon nitride (SiCN).

In other embodiments, a fin liner layer (not shown) is formed on the vertical sidewalls of the vertical fin channels 202. In certain of these embodiments, the fin liner layer is formed of SiN and is formed through a combination of deposition and reactive ion etching (RIE). In general, RIE refers to an etching technology used in microfabrication. RIE is a type of dry etching which has different characteristics than wet etching. RIE uses chemically reactive plasma to remove material deposited on wafers. The plasma is generated under low pressure (vacuum) by an electromagnetic field. High-energy ions from the plasma attack the wafer surface and react with it. Like other dry plasma etch techniques, RIE has benefits such as etch rate, anisotropy, selectivity, uniformity, aspect ratio, and minimization of substrate damage. However, it should be appreciated that any suitable etching method or photolithography method known by one of skill in the art may be used to form the plurality of VFET devices.

Figure 5:
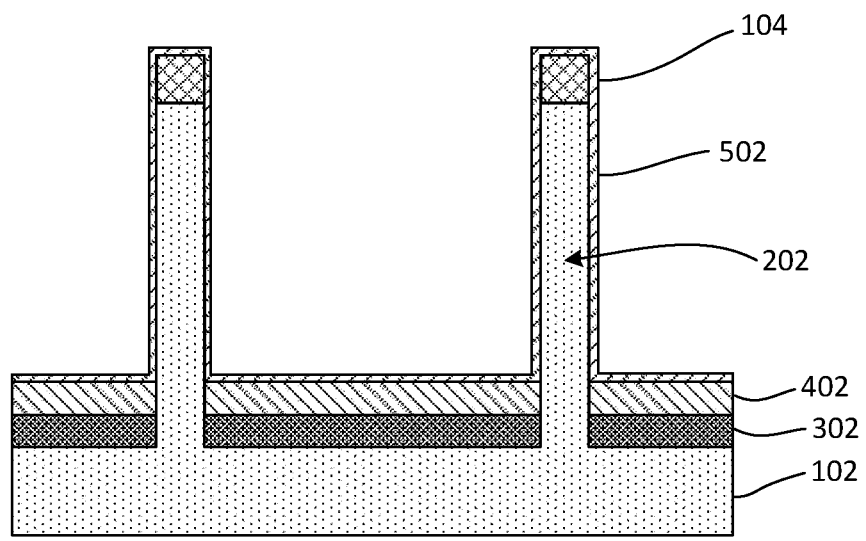
FIG. 5 is a cross-sectional view of the VFET of FIG. 4, where a high-κ layer is formed on the bottom spacer layer and around the vertical fin channels, according to embodiments.

Referring now to FIG. 5, following the formation of the bottom source/drain electrode 302 and the bottom spacer 402, a gate stack (i.e., a gate electrode structure) is formed on the vertical fin channels 202. According to embodiments, the gate stack includes a conformal gate dielectric layer 502 that is deposited onto the vertical fin channels 202, and a gate conductor layer 602 (see, FIG. 6) formed on the gate dielectric layer 502. The conformal gate dielectric layer 502 comprises a high-κ gate dielectric material. In general, the term high-κ refers to a material with a high dielectric constant (κ, kappa), as compared to silicon dioxide. High-κ dielectrics are used in semiconductor manufacturing processes where they are usually used to replace a silicon dioxide gate dielectric or another dielectric layer of a device. Thus, the term high-κ as used herein refers to a material having a relative dielectric constant κ which is much higher than that of silicon dioxide (e.g., a dielectric constant κ=25 for hafnium oxide ($HfO_2$) rather than 4 for silicon dioxide). Examples of suitable high-κ gate dielectric materials include, but are not limited to, $HfO_2$ and/or lanthanum oxide ($La_2O_3$).

Figure 6:
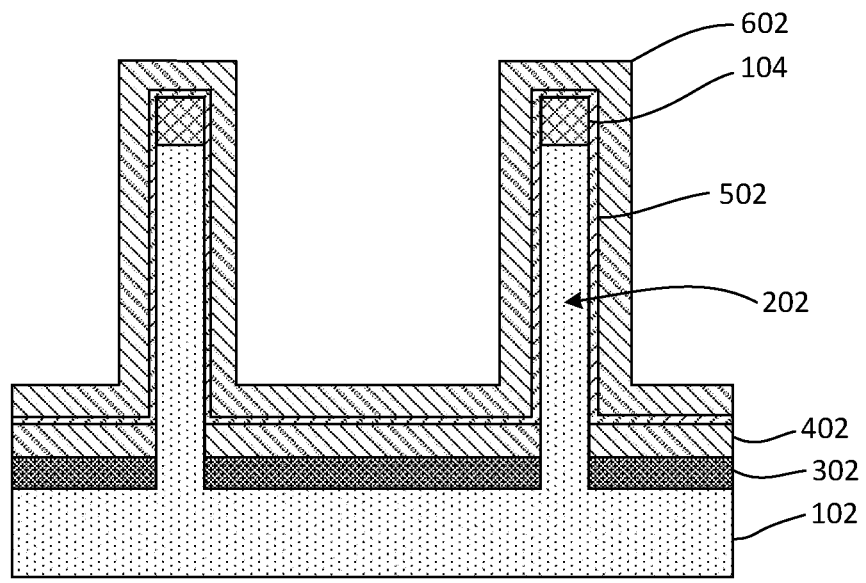
FIG. 6 is a cross-sectional view of the VFET of FIG. 5, where a gate conductor layer (e.g., a work function metal (WFM) layer) is formed on the high-κ layer.

Referring now to FIG. 6, in certain embodiments, the gate stack also includes a conformal gate conductor layer 602 that is deposited onto the gate dielectric layer 502. In certain embodiments, the conformal gate conductor layer 602 is a workfunction-setting metal (WFM). The particular workfunction-setting metal employed can vary depending on whether an n-type or p-type transistor is desired. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n-type and p-type workfunction metals given above.

Figure 7:
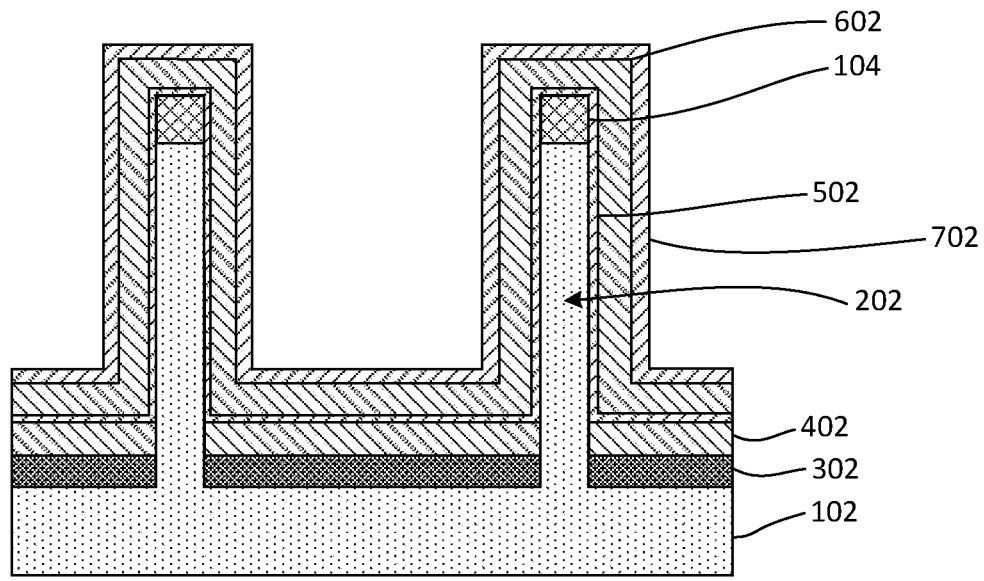
FIG. 7 is a cross-sectional view of the VFET of FIG. 6, where a first liner layer is formed on the gate conductor layer, according to embodiments.

Referring now to FIG. 7, in certain embodiments, a first liner layer 702 is formed on the gate conductor layer 602. The first liner layer 702 can be composed of SiBC, and it is deposited is such a way as to encapsulate the gate stack. It should be appreciated that SiBC is merely one example material, and any other suitable material or combination of materials can be used.

Figure 8:
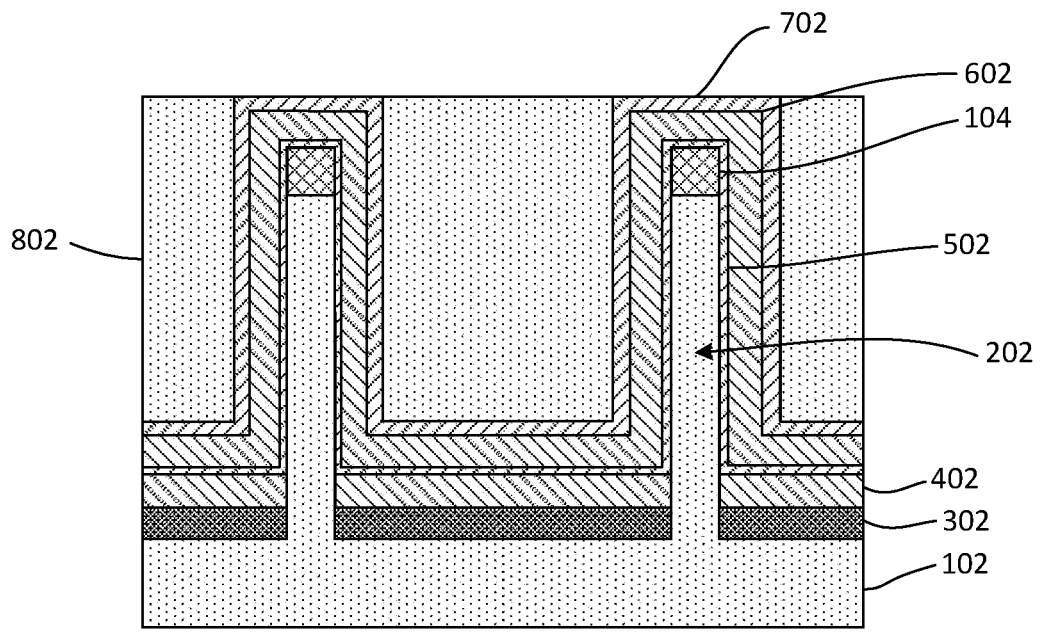
FIG. 8 is a cross-sectional view of the VFET of FIG. 7, where a gap fill dielectric layer is formed on the first liner layer and between the vertical fin channels, according to embodiments.

Referring now to FIG. 8, the vertical fin channels 202 are then buried in a gap fill dielectric 802, which also covers the first liner layer 702. As shown in FIG. 8, the gap fill dielectric 802 fills in the spaces between the vertical fin channels 202. According to an embodiment, the gap fill dielectric 802 is an organic planarizing material such as an aromatic cross-linkable polymer (e.g., naphthalene-based). Other suitable organic planarizing materials may also be used. After the first liner layer 702 and the gap fill dielectric 802 are formed, the wafer is subjected to chemical mechanical polishing (CMP) to planarize the top surface of the VFET devices. The CMP is performed such that a top portion of the gap fill dielectric 802 is exposed, and it coplanar with the top surface of the first liner layer 702.

Figure 9:
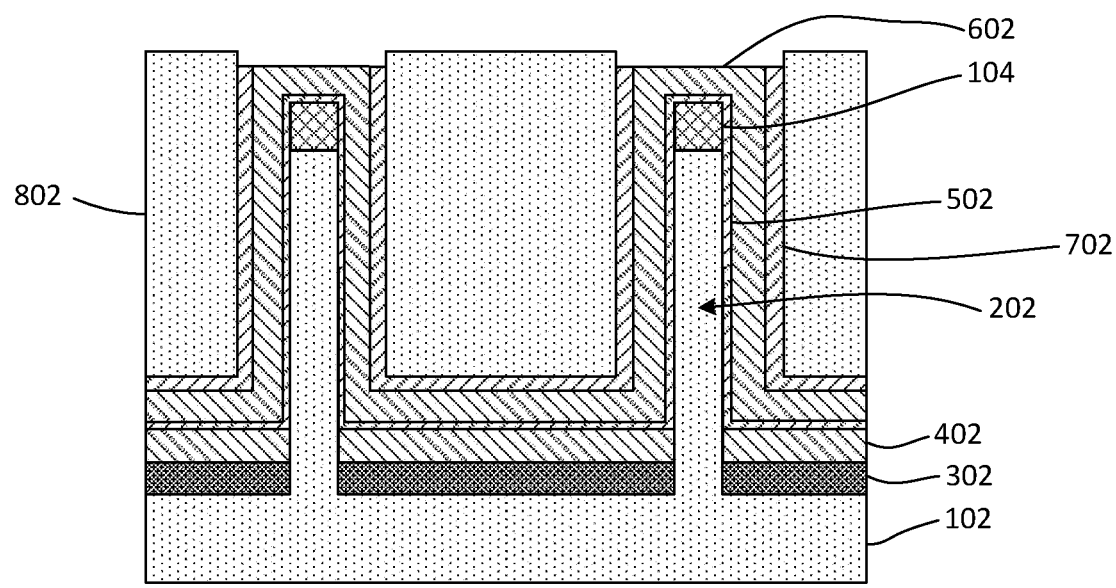
FIG. 9 is a cross-sectional view of the VFET of FIG. 8, where portions of the gap fill dielectric layer and the first liner layer have been removed to expose portions of the gate conductor layer, according to embodiments.

Referring now to FIG. 9, the exposed top surface of the first liner layer 702 is removed with selective reactive ion etching (REI). This top portion of the first liner layer 702 is removed to expose a top portion of the underlying gate conductor layer 602. Thus, at this stage, the workfunction-setting metal (WFM) of the gate conductor layer 602 is exposed to allow for further processing.

Figure 10:
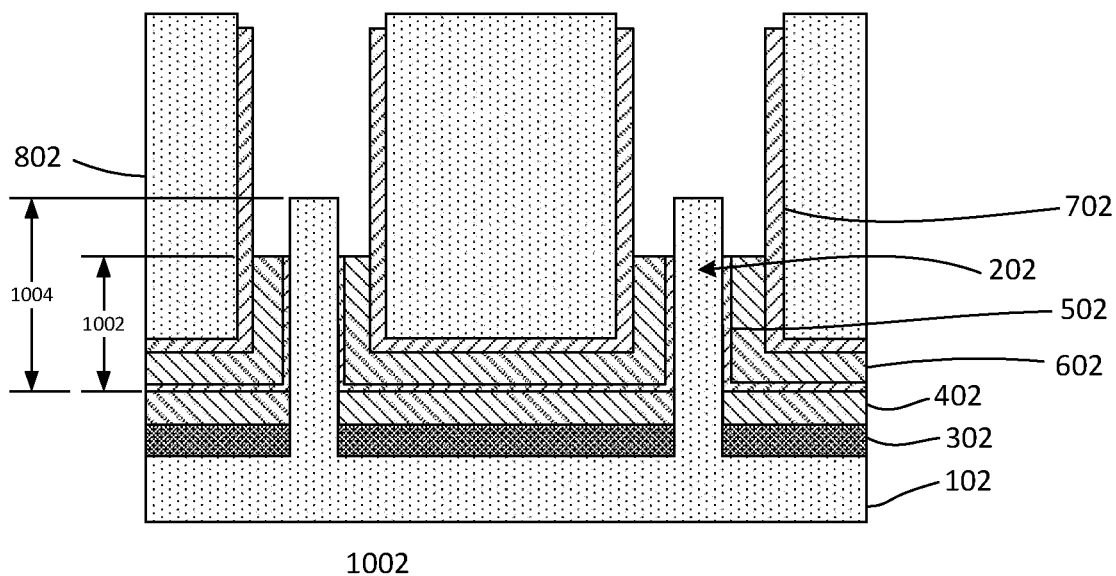
FIG. 10 is a cross-sectional view of the VFET of FIG. 9, where portions of the gate conductor layer and the high-κ layer have been removed to define a channel length of the VFET, according to embodiments.

Referring now to FIG. 10, vertical wet etching is performed to remove a portion of the gate conductor layer 602. This is followed by etching to remove a portion of the gate dielectric layer 502. As shown in FIG. 10, the gate conductor layer 602 and the gate dielectric layer 502 are removed by etching below a top surface of the vertical fin channels 202. As such, a first distance 1002 between a top surface of the bottom spacer layer 402 and top surfaces of the remaining gate conductor layer 602 and gate dielectric layer 502 is less than a second distance 1004 between the top surface of the bottom spacer layer 402 and a top surface of the vertical fin channels 202. The first distance 1002 defines the channel length of the VFET devices.

Figure 11:
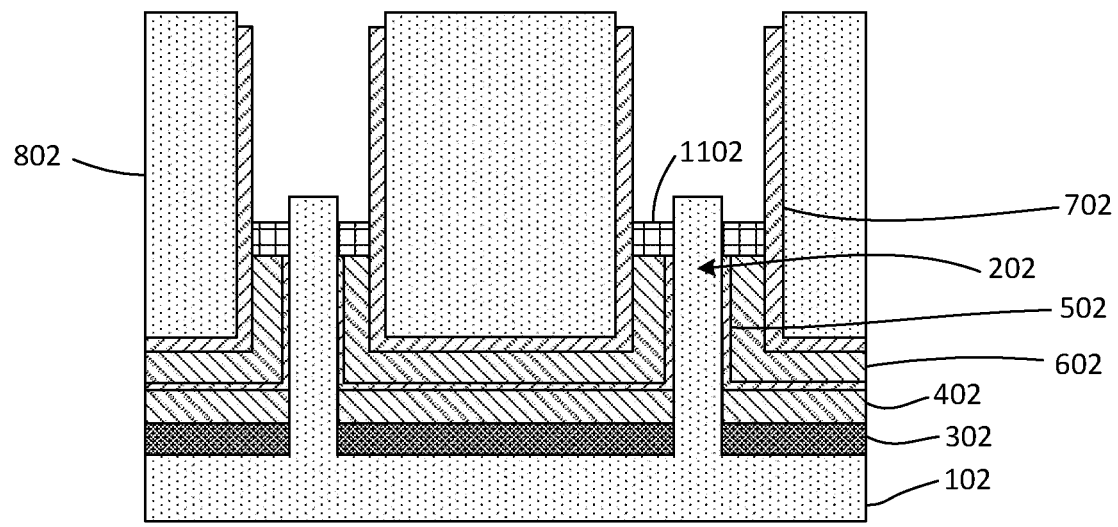
FIG. 11 is a cross-sectional view of the VFET of FIG. 10, where a top spacer layer is formed on the gate conductor layer and between vertical portions of the first liner layer and the vertical fin channels, according to embodiments.

Referring now to FIG. 11, a top spacer layer 1102 is formed by a deposition technique on top of the remaining gate conductor layer 602 and gate dielectric layer 502, and in the spaces between the vertical fin channel 202 and the first liner layer 702. After the top spacer layer 1102 is deposited, it is etched back to a desired thickness. In an embodiment, the thickness of the top spacer layer 1102 is set so that the top surface of the top spacer layer 1102 is lower than the top surface of the vertical fin channel 202. However, in this embodiment, the processing of the top spacer layer 1102 is not yet complete, and further material will be added to change the cross-sectional shape of this layer into an inverted T-shaped profile, as discussed in further detail below.

Figure 12:
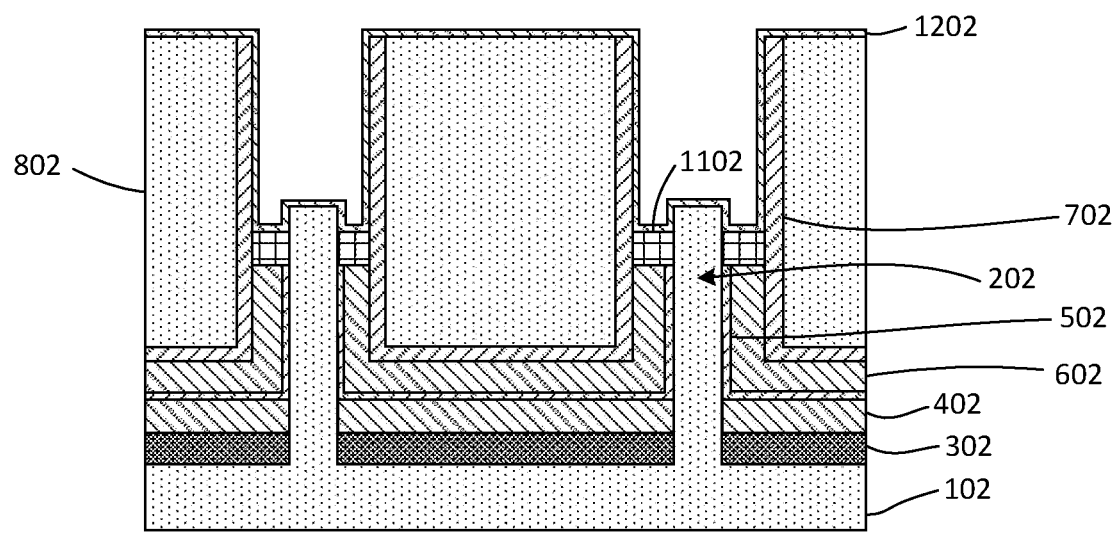
FIG. 12 is a cross-sectional view of the VFET of FIG. 11, where a conformal second liner layer is formed over the gap fill dielectric layer, the first liner layer, the top spacer layer and the vertical fin channels, according to embodiments.

Referring now to FIG. 12, a dielectric liner layer 1202 is formed through a combination of deposition and reactive ion etching (RIE). In one example, the dielectric liner layer 1202 is comprised of $SiO_2$. However, it should be appreciated that any other suitable dielectric material or combination of materials may be used. As shown in FIG. 12, the dielectric layer 1202 is initially deposited to conformally cover the entire top surface of the wafer (i.e., all exposed top surfaces of the gap fill dielectric 802, the first liner layer 702, the top spacer layer 1102, and the vertical fin channel 202).

Figure 13:
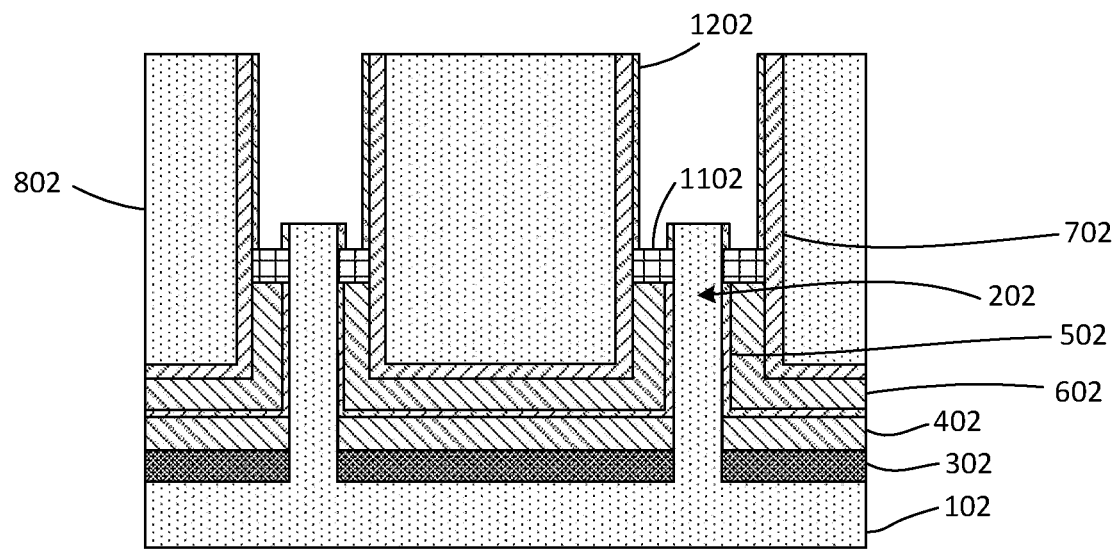
FIG. 13 is a cross-sectional view of the VFET of FIG. 12, where the second liner layer has been etched to remove the horizontal portions thereof, thus leaving the vertical sidewall portions thereof, according to embodiments.

Referring now to FIG. 13, the dielectric liner layer 1202 is subjected to directional reactive ion etching (RIE) to form sidewall liners. Thus, top portions of the dielectric liner layer 1202 have been removed to leave only the vertical sidewall portions thereof. As shown in FIG. 13 the remaining vertical portions of the dielectric liner layer 1202 are formed on sidewalls of the first liner layer 702 and the vertical channel fin 202. Because the vertical portions of the dielectric liner layer 1202 have a certain thickness to them, a width of the gap above the top spacer layer 1102 is less than the thickness of the underlying portion of the top spacer layer 1102. This gap above the top spacer layer 1102 serves as an area where continued growth of the top spacer layer 1102 can take place, as discussed in further detail with respect to FIG. 14.

Figure 14:
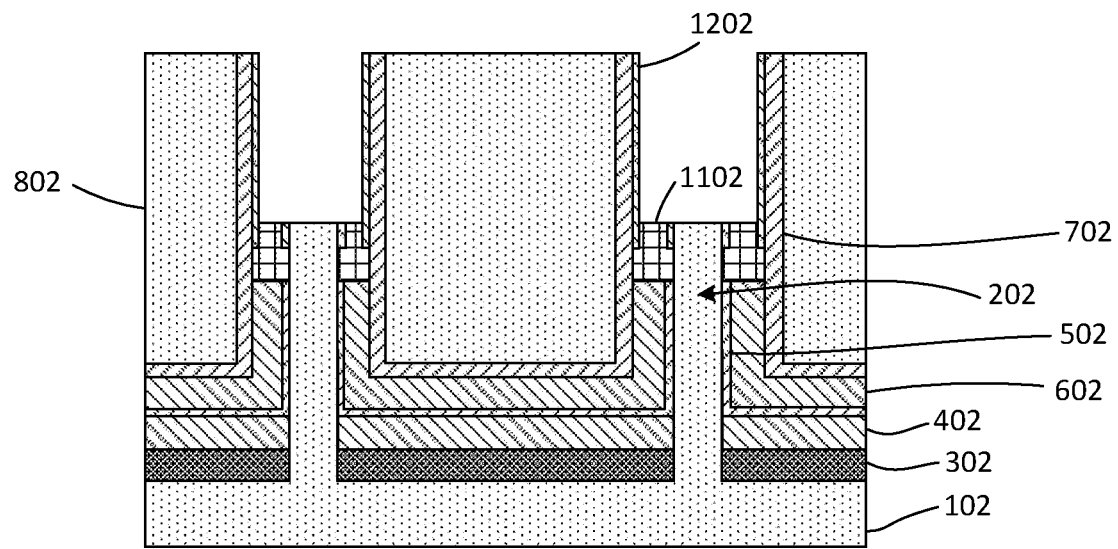
FIG. 14 is a cross-sectional view of the VFET of FIG. 13, where additional material is added on top of the first spacer layer and between the vertical sidewall portions of the second liner layer to form the inverse T-shaped top spacer layer, according to embodiments.

Referring now to FIG. 14, further material is deposited on the top spacer layer 1102, in order to complete the formation of the T-shaped top spacer layer. In one embodiment, the further material that is added is silicon nitride (SiN), which is the same material as the underlying portion of the top spacer layer 1102. However, it should be appreciated that other materials or combinations of materials may be used. Thus, because of the thickness of the dielectric liner layer 1202, the thickness of the newly formed upper portion of the top spacer layer 1102 is less than the thickness of the previously formed lower portion of the top spacer layer 1102. Accordingly, the entire top spacer layer 1102 has an inverted T-shaped profile when viewed in cross-section. In one embodiment, the upper portion of the top spacer layer 1102 is formed by a SiN fill, followed by etching the layer back to be even with the top surface of the vertical channel fin 202.

Figure 15:
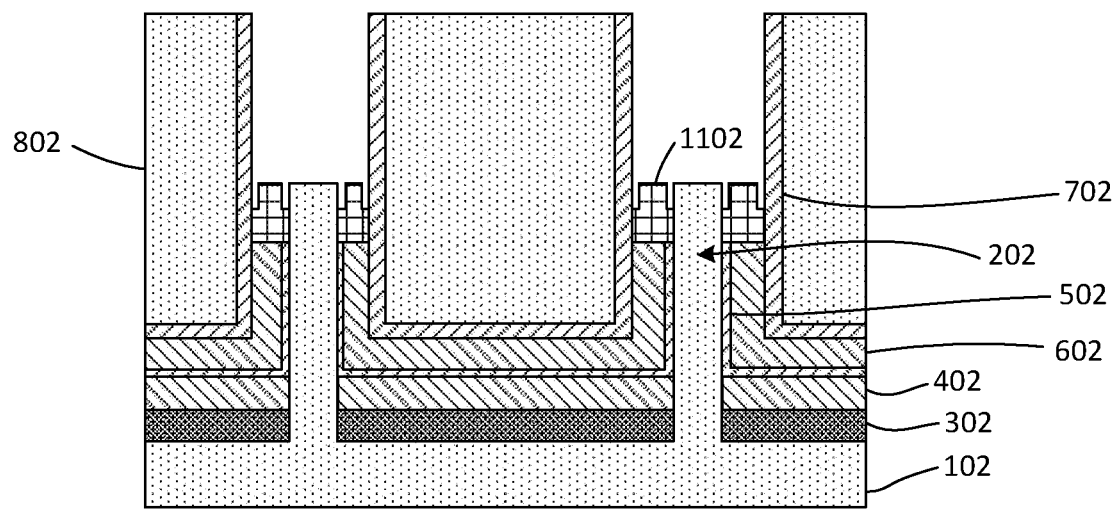
FIG. 15 is a cross-sectional view of the VFET of FIG. 14, where remaining portions of the second liner layer are removed leaving horizontal gaps between the inverse T-shaped top spacer layer and the first liner layer, according to embodiments.

Referring now to FIG. 15, the remaining vertical portions of the dielectric liner layer 1202 are removed by etching, leaving only the inverse T-shaped top spacer layer 1102. By removing the remaining portions of the dielectric liner layer 1202, a topmost surface of the T-shaped top spacer layer 1102 and midlevel surfaces of the T-shaped top spacer layer 1102 are exposed. This results in empty spaces, or gaps, between the vertical channel fin 202 and the upper portion of the T-shaped top spacer layer 1102.

Figure 16A:
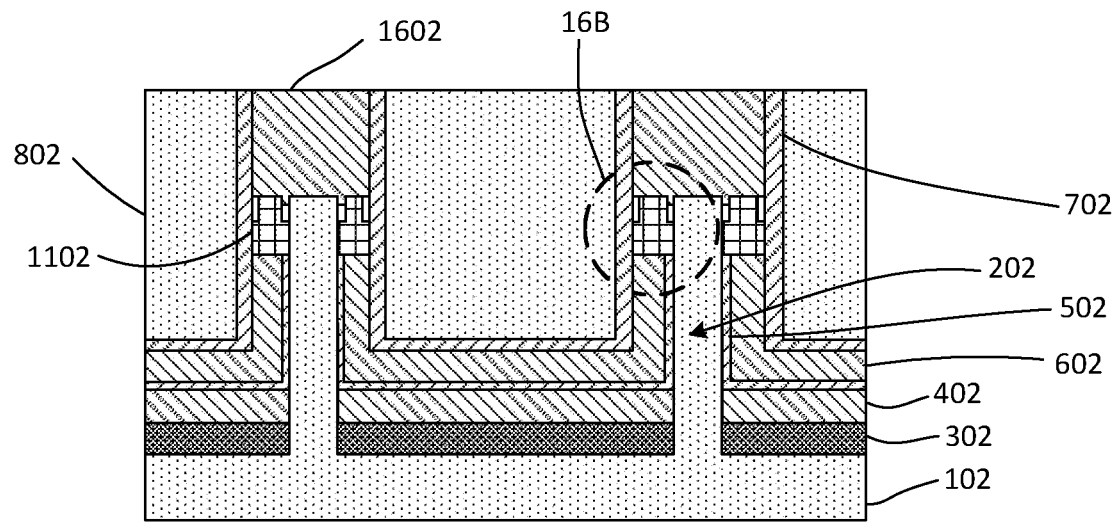
FIG. 16A is a cross-sectional view of the VFET of FIG. 15, where the top source/drain electrode is formed on the inverse T-shaped spacer layer.

Referring now to FIG. 16A, the top source/drain electrode 1602 is formed. It should be appreciated that the top source/drain electrode 1602 can be formed from the same materials as the bottom source/drain electrode 302, or it can be formed of different materials. In an embodiment, the top source/drain electrode 1602 is formed by epitaxial growth of the layer. Due to the inverse T-shaped top spacer layer 1102 profile, the epitaxial growth of the top source/drain electrode 1602 is confined to the top surface of the vertical channel fin 202. This results in an encased air gap in the top spacer region. In certain embodiments, the top electrode is the source electrode and the bottom electrode is the drain electrode. However, in other embodiments, the bottom electrode is the source electrode and the top electrode is the drain electrode.

Figure 16B:
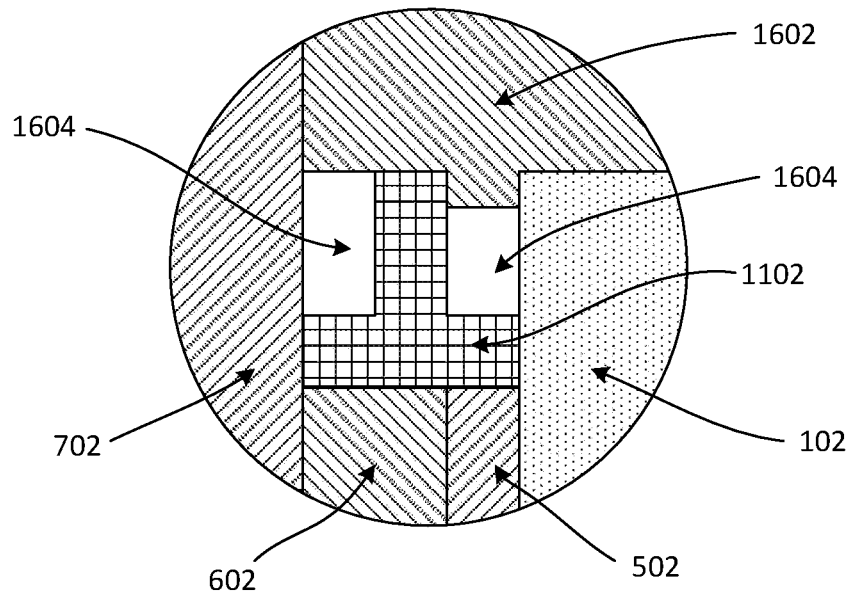
FIG. 16B is an enlarged partial cross-sectional view of FIG. 16A showing detail of the inverse T-shaped spacer, according to embodiments.

Referring now to FIG. 16B, this figure shows an enlarged partial view of the portion of FIG. 16A indicated by dashed circle. FIG. 16B shows the full view of the inverse T-shaped top spacer layer 1102, and the airgaps 1604 that are formed to the right side and the left side of the upper portion of the inverse T-shaped top spacer layer 1102. As also shown in FIG. 16B, a portion of the top source/drain electrode 1602 intrudes partially in to the airgap 1604 on the right side of the upper portion of the inverse T-shaped top spacer layer 1102. However, the epitaxial growth of the top source/drain electrode 1602 is limited because of the top surface of the vertical channel fin 202. Accordingly, even if a portion of the right airgap 1604 is filled with source/drain electrode material, the gap is not completely filled. Thus, the airgaps 1604 to the right and left of the T-shaped top spacer layer 1102 have the effect of reducing the parasitic capacitive coupling between the top source/drain electrode 1602 and the gate stack structure (i.e., the gate conductor layer 602).

To understand the effects of the airgaps 1604 on the amount of capacitive coupling between the gate conductor layer 602 and the top source/drain electrode 1602, a device technology computer-aided design simulation was run, with the results appearing in Table 1 below. In general, technology computer-aided design (technology CAD or TCAD) is a branch of electronic design automation that models semiconductor fabrication and semiconductor device operation. The modeling of the fabrication is termed Process TCAD, while the modeling of the device operation is termed Device TCAD.

TABLE 1

| $F_{PG}$ (top drain, 70% ckt) | VFET with Standard Spacer Having No Air Gaps | VFET with T-shaped Spacer with Airgaps |
|---|---|---|
| $I_{eff}$ n/p (uA/μm) | 331/308 | 330/307 |
| $C_{gd}$ (fF/μm) | 0.174 | 0.158 |
| $C_{gs}$ (fF/μm) | 0.200 | 0.200 |
| $C_{gg}$ n/p (fF/μm) | 0.708/0.705 | 0.692/0.689 |
| $F_{PG}$ top drain (GHz) | 76.6 | 78.0 |

In Table 1 above, ckt refers to the circuit, $I_{eff}$ is the effective current, $C_{gd}$ is the gate to drain electrode capacitance, $C_{gs}$ is the gate to source electrode capacitance, and $C_{gg}$ is the total capacitance of the VFET device. The simulation was evaluated using an FET gate capacitance pole ($F_{PG}$) for an FO3 inverter (i.e., a fan-out on 3 inverter) with a 50% back end of line (BEOL) load and the top source/drain as the drain electrode (70% ckt is in this case). In this simulated example, the air gaps have a height and width of approximately 5 nm. According to the results shown in Table 1, this simulated example of the present embodiment enables a roughly 10% reduction in $C_{gd}$, and has a very small degradation in $I_{eff}$. This results in an approximately 2% $F_{PG}$ gain relative to the VFET with no air gaps.

Figure 17:
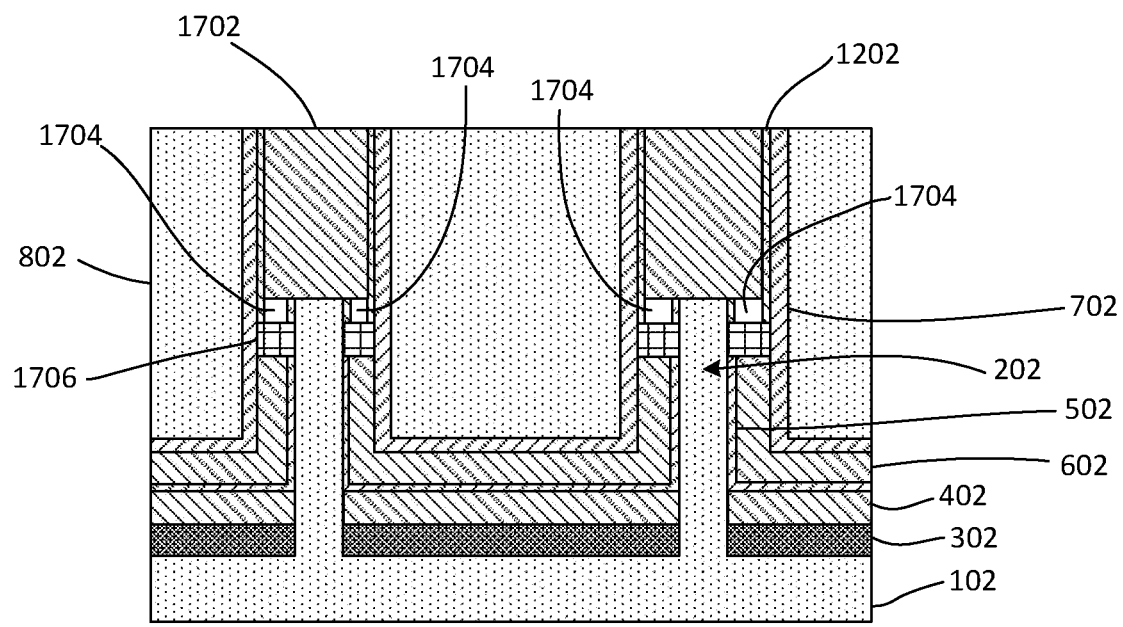
FIG. 17 is a cross-sectional view of the VFET device of FIG. 13, where the top source/drain electrode is formed on the vertical fin channels and between the vertical portions of the second liner layer.

Referring now to FIG. 17, this figure shows another embodiment of a VFET device having air gaps 1704 underneath the top source/drain electrode 1702. However, in this embodiment, the spacer layer does not have the inverted T-shaped cross-sectional profile as shown in the embodiment of FIG. 16B is not included. In particular, FIG. 17 shows a cross-sectional view of a VFET device at the same stage of manufacture as in FIG. 13 of the previous embodiment, but in this embodiment the top source/drain electrode 1702 is formed directly on the vertical fin channels 202 and between the vertical sidewall portions of the dielectric liner layer 1202. In this embodiment, there is still a top spacer layer 1706 formed, but it is not formed into an inverted T-shape. Thus, in contrast to the embodiment shown in FIG. 16B where the air gaps 1604 are formed on the right and left sides of the T-shaped spacer 1102, in the embodiment shown in FIG. 17 the air gaps 1704 are formed above the top surface of the first spacer layer 1706. In the previous embodiment shown in FIG. 16B, the inverse T-shaped spacer confined the epitaxial growth of the source/drain electrode 1602 such that the source/drain electrode 1602 did not protrude all the way into the air gaps 1604. However, in this embodiment, the vertical portions of the dielectric liner layer 1202 have a certain thickness, and the thickness of this layer confines the epitaxial growth of the source/drain electrode 1702. Although the air gaps 1704 in the embodiment of FIG. 17 are formed in a different manner from the air gaps in the embodiment of FIG. 16B, they have the same effect of reducing the parasitic capacitive coupling between the top source/drain electrode 1702 and the gate electrode (e.g., the gate conductor layer 602).

It should be appreciated that other suitable cross-sectional profiles of the top spacer layer could be utilized, provided that some form of an air gap is present between the gate conductor layer and the top source/drain electrode to effect a decrease in the parasitic capacitive coupling therebetween.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a vertical transport field-effect transistor, the method comprising: forming vertical fin channels by etching partially through a substrate; forming a first source/drain electrode partially into the substrate; forming a first spacer layer on the first source/drain electrode; forming a gate dielectric layer on the first spacer layer and on the vertical fin channels; forming a gate conductor layer on the gate dielectric layer; removing portions of the gate dielectric layer and the gate conductor layer such that heights of these layers are less than a height of the vertical fin channels; forming a second spacer layer on a top surface of the gate conductor layer; and forming a second source/drain electrode on a top surface of the vertical fin channels, wherein an air gap exists directly between the second source/drain electrode and the second spacer layer and surrounds a portion of the vertical fin channels.

2. The method of claim 1, wherein the second spacer layer has an inverted T-shaped cross-sectional profile.

3. The method of claim 2, wherein a plurality of air gaps exist between the second source/drain electrode and the second spacer layer.

4. The method of claim 1, further comprising:
   forming a first liner layer on the gate conductor layer; and
   forming a gap fill dielectric layer between the vertical fin channels, where a top surface of the first liner layer is coplanar with a top surface of the gap fill dielectric layer.

5. The method of claim 4, further comprising:
removing an upper portion of the first liner layer to expose the gate conductor layer;
removing upper portions of the gate conductor layer and the gate dielectric layer so that the top surfaces thereof are lower than a top surface of the vertical fin channels;
forming the second spacer layer on the top surfaces of both the gate conductor layer and the gate dielectric layer.

6. The method of claim 5, further comprising:
forming a dielectric liner layer on exposed vertical surfaces of the first liner layer;
depositing additional material on the second spacer layer and between vertical sidewall surfaces of the dielectric liner layer such that the second spacer layer has an inverted T-shapes cross-sectional profile;
removing any remaining portions of the dielectric liner layer, leaving an exposed topmost surface of the second spacer layer and exposed midlevel surfaces of the second spacer layer; and
forming the second source/drain electrode on the top surfaces of the vertical fin channels and the second spacer layer, leaving the air gaps between the second source/drain electrode and the midlevel surfaces of the second spacer layer.

7. The method of claim 5, further comprising:
forming a dielectric liner layer on exposed vertical surfaces of the first liner layer; and
forming the second source/drain electrode on the top surfaces of the vertical fin channels and the second spacer layer, thus leaving the air gap between the top source/drain electrode and a topmost surface of the second spacer layer.

8. The method of claim 1, wherein a top surface of the second spacer layer is coplanar with the top surface of the vertical fin channels.

9. The method of claim 1, wherein the second spacer layer comprises SiN.

10. The method of claim 4, wherein the first liner layer comprises a material selected from the group consisting of: silicon nitride (SiN), silicon boron carbon nitride (SiBCN), silicon oxycarbon nitride (SiOCN), silicon carbon oxide (SiCO), silicon carbon nitride (SiCN), and combinations thereof.

11. A vertical transport field-effect transistor comprising: a substrate including a plurality of vertical fin channels extending from a surface of the substrate; a first source/drain electrode provided on the substrate; a first spacer layer provided on the first source/drain electrode and between adjacent vertical fin channels; a gate dielectric layer provided on the first spacer layer; a gate conductor layer provided on the gate dielectric layer, where heights of the gate dielectric layer and the gate conductor layer are less than a height of the vertical fin channels; a second spacer layer provided on a top surface of the gate conductor layer; and a second source/drain electrode provided on a top surface of the vertical fin channels, wherein an air gap exists directly between the second source/drain electrode and the second spacer layer and surrounds a portion of the vertical fin channels.

12. The vertical transport field-effect transistor of claim 11, wherein the second spacer layer has an inverted T-shaped cross-sectional profile.

13. The vertical transport field-effect transistor of claim 12, wherein a plurality of air gaps exist between the second source/drain electrode and the second spacer layer.

14. The vertical transport field-effect transistor of claim 11, further comprising:
a first liner layer provided on the gate conductor layer; and
a gap fill dielectric layer provided between the vertical fin channels, where a top surface of the first liner layer is coplanar with a top surface of the gap fill dielectric layer and a top surface of the second source/drain electrode.

15. The vertical transport field-effect transistor of claim 11, further comprising:
a first liner layer provided on the gate conductor layer; and
a dielectric liner layer provided on sidewalls of the vertical fin channels above the second spacer layer and on sidewalls of the first liner layer above the second spacer layer,
wherein the gap exists between the second source/drain electrode and the second spacer layer, and between vertical sidewall portions of the dielectric liner layer.

16. The vertical transport field-effect transistor of claim 11, wherein a top surface of the second spacer layer is below the top surface of the vertical fin channels.

17. The vertical transport field-effect transistor of claim 11, wherein the second spacer layer comprises SiN.

18. The vertical transport field-effect transistor of claim 14, wherein the first liner layer comprises a material selected from the group consisting of: silicon nitride (SiN), silicon boron carbon nitride (SiBCN), silicon oxycarbon nitride (SiOCN), silicon carbon oxide (SiCO), silicon carbon nitride (SiCN), and combinations thereof.

19. The vertical transport field-effect transistor of claim 11, wherein the gate conductor layer comprises a material selected from the group consisting of: titanium nitride (TiN), tantalum nitride (TaN), aluminum (Al)-containing alloys, titanium aluminide (TiAl), titanium aluminum nitride (TiAlN), titanium aluminum carbide (TiAlC), tantalum aluminide (TaAl), tantalum aluminum nitride (TaAlN), tantalum aluminum carbide (TaAlC), tungsten (W), and combinations thereof.

20. The vertical transport field-effect transistor of claim 11, wherein the gate dielectric layer comprises a material selected from the group consisting of: hafnium oxide ($HfO_2$), lanthanum oxide ($La_2O_3$), and combinations thereof.

* * * * *